United States Patent
Whetten

Patent Number: 5,498,573
Date of Patent: Mar. 12, 1996

[54] METHOD OF MAKING MULTI-LAYER ADDRESS LINES FOR AMORPHOUS SILICON LIQUID CRYSTAL DISPLAY DEVICES

[75] Inventor: Nathan R. Whetten, Ballston Lake, N.Y.

[73] Assignee: General Electric Company, Schenectady, N.Y.

[21] Appl. No.: 897,634

[22] Filed: Jun. 12, 1992

Related U.S. Application Data

[62] Division of Ser. No. 442,864, Nov. 29, 1989, Pat. No. 5,153,754.

[51] Int. Cl.$^6$ .................................................. H01L 21/441
[52] U.S. Cl. ............................ 437/192; 437/194; 437/50; 257/59
[58] Field of Search ................................. 437/40, 48, 49, 437/192, 194, 50–51, 195; 257/59

[56] References Cited

U.S. PATENT DOCUMENTS

| | | | |
|---|---|---|---|
| 4,543,573 | 9/1985 | Fuyama et al. | 340/781 |
| 4,673,969 | 6/1987 | Ariizumi et al. | 357/71 |
| 4,804,953 | 2/1989 | Castleberry | 340/784 |
| 4,918,504 | 4/1990 | Kato et al. | |
| 5,028,551 | 7/1991 | Dohjo et al. | 437/41 |
| 5,062,690 | 11/1991 | Whetten | 359/59 |
| 5,148,248 | 9/1992 | Possin et al. | 357/23.7 |
| 5,153,754 | 10/1992 | Whetten | 359/59 |

*Primary Examiner*—George Fourson
*Assistant Examiner*—Richard A. Booth
*Attorney, Agent, or Firm*—Donald S. Ingraham; Marvin Snyder

[57] ABSTRACT

Each scan line of a liquid crystal display (LCD) includes: a first layer of titanium disposed on the LCD substrate surface to promote adhesion of the scan line to the substrate surface; a layer of molybdenum or aluminum disposed on the first titanium layer to provide a low resistance address line; and a second layer of titanium disposed on the molybdenum layer to promote adhesion of a subsequently deposited layer of passivation material, semiconductor material or the like over the scan line. The multi-layered scan line side walls may be etched to promote step coverage of subsequently deposited layers of material. The data lines may also have a multi-layer conductor structure similar to the scan lines.

12 Claims, 4 Drawing Sheets

METHOD OF MAKING MULTI-LAYER ADDRESS LINES FOR AMORPHOUS SILICON LIQUID CRYSTAL DISPLAY DEVICES

This application is a divisional of U.S. application Ser. No. 07/442,864 filed Nov. 29, 1989, now U.S. Pat. No. 5,153,754.

BACKGROUND OF THE INVENTION

The present invention relates to liquid crystal display (LCD) devices and, more particularly, to a novel metallization system for the scan and data lines which address each pixel (picture element) of the pixel array making up the LCD.

A liquid crystal display (LCD) device typically comprises a pair of flat panels (usually a glass substrate and a cover glass) sealably containing a quantity of liquid crystal material, such as a dichroic dye guest/host system or a twisted nematic formulation. One of the flat panels will usually have conductive material disposed on, and substantially completely covering, an inner surface to form a "ground plane" electrode. A plurality of electrodes, formed from a transparent conductive material such as indium tin oxide (ITO), will be disposed on the opposite panel and will usually be arranged in uniform columns and rows to form an X-Y matrix structure. These electrodes are generally referred to as "pixel" electrodes. Thus, in a LCD device a typical cell or pixel includes liquid crystal material disposed between a pixel electrode and a ground electrode, which effectively forms a capacitor disposed between the two flat panels. If the LCD device is to operate by reflected light, as in a digital watch or calculator display, only the opposite panel (on which the ITO electrodes are disposed) need be transparent; the other panel will be formed with a reflective surface. If the LCD device is to be light transmissive, then both flat panels should be transparent and the ground plane electrode should also be formed from a transparent material (such as ITO and the like).

A semiconductor switch, such as a thin-film field-effect transistor (FET) and the like, is integrally formed with each pixel to control operation of that pixel in the display. FETs are preferred in LCDs because of their potentially small size, low power consumption, favorable switching speeds, ease of fabrication, and compatibility with conventional LCD structures.

Electrical communication with the individual pixel FETs is accomplished by a plurality of X-address lines or scan lines, typically one for each row (or column) of pixels, and a plurality of Y-address lines or data lines, one for each column (or row) of pixels. The scan lines are usually connected to the gate electrodes of the pixel FETs and the data lines are usually connected to the source electrodes. The drain electrode of each FET is connected to the pixel electrode. An individual pixel may be addressed by applying a voltage of sufficient magnitude to one of the scan lines to cause the FETs in the row corresponding to the scan line to "switch-on" to a conducting state. If a data voltage is applied to a data line while an FET in the column corresponding to the data line is in an "on" state, the pixel capacitor will charge and store the data voltage after the scan line voltage has decreased to a level sufficient to turn-off the FET. Each pixel in the display may be individually addressed in this manner. Depending upon the magnitude of the data voltage applied to the pixel electrode, the optical properties of the liquid crystal material are altered. The data voltage magnitude may be such as to: allow no light transmission through the pixel (off); allow maximum light transmission through the pixel (on); or provide an intermediate gray scale level of light transmission.

The charge on the pixel capacitor may be refreshed or updated at video rates, preferably about every $10^{-3}$ seconds or less, to maintain the image on the LCD device and prevent flickering of the display. Thus, in a large matrix display having about 600×600 pixels, a scan line voltage is applied for only a few microseconds and the scan line, in combination with the corresponding pixels of that scan line row, must attain and hold the desired potential in that time period. Additionally, the data line voltage is also only applied for a few microseconds and during this time the pixel capacitor must also charge and maintain the desired data line potential. The ability of each individual scan and data line with the corresponding pixel to attain and hold the desired potential during this short time period is limited by the RC time constant of the line. Therefore, it is important that the line resistance be as low as possible. Having the lowest possible scan and data line resistance possible will become even more critical as LCD devices increase in size and resolution because the scan and data lines will become longer with more pixels connected to each line.

Currently, titanium is used extensively for the scan lines and FET gates of LCD devices; titanium etches well and exhibits good adhesion characteristics to the underlying LCD substrate and to subsequently deposited layers, but has a high bulk resistivity (42 µohms-cm). Some practitioners in the art have used materials such as chromium, tantalum, molybdenum and aluminum, but these metals all present certain disadvantages. Chromium, tantalum and molybdenum may require special processing procedures which are compatible with their use. Additionally, chromium and tantalum have bulk resistivities of 13 µohm-cm and 12.5 µohm-cm, respectively; molybdenum has a low bulk resistivity (5.2 µohm-cm) but exhibits poor adhesion characteristics to the underlying LCD substrate and to the overlying insulation layer. Aluminum also has a low bulk resistivity (2.65 µohm-cm) but chemically reacts when exposed to an ionic solution, such as photoresist stripper R10 and the like, which can corrode and dissolve the aluminum. Additionally, address lines fabricated from only aluminum cannot be laser welded to make repairs if any of the lines are open or shorted.

It is accordingly a primary object of the present invention to provide a novel scan and data address line metallization system which is not subject to the foregoing disadvantages.

It is another object of the present invention to provide scan and data address line structures which provide refreshing of the pixels at standard video rates.

It is a further object of the present invention provide scan and data address line structures which have low RC time constants and which are compatible with currently practiced fabrication procedures.

These and other objects of the invention, together with the features and advantages thereof, will become apparent from the following detailed specification when read with the accompanying drawings in which like reference numerals refer to like elements.

SUMMARY OF THE INVENTION

In accordance with the present invention, a liquid crystal display device includes an array of a multiplicity of pixels arranged substantially in rows and columns, a plurality of electrically conductive scan lines and a plurality of electrically conductive data lines. Each scan line transmits electrical signals to one row of pixels and each data line transmits electrical signals to one column of pixels. Each scan line includes a first layer of conductive material deposited on a substrate surface of the LCD device, and selected to adhere to the substrate surface and be laser-weldable; and a second layer of conductive material deposited on the first layer and selected to have a low-bulk resistance. The first layer of conductive material is preferably titanium (Ti) having a thickness between about 400 and about 1000 angstroms. The second layer is preferably molybdenum (Mo) or aluminum (Al) with a thickness of about 1000 angstroms. The first and second layers are preferably deposited by sputtering in a single pumpdown. The multilayer scan line may be etched to provide tapered side walls which will promote good step coverage of subsequently deposited layers of material. If the second layer is Mo, the Mo layer is preferably wet etched by a PAWN (phosphoric acid, acetic acid, water and nitric acid) etch solution and the bottom Ti layer is preferably dry etched by placing the wafer in a plasma barrel etcher with an atmosphere of $CF_4$ and $O_2$ or $SF_6$ and $O_2$. If the second layer is Al, the first and second layers are preferably etched by a RIE solution using a mixture of $BCl_3$, $CCl_4$ and $O_2$, which simultaneously etches at the same rate, both the Al and Ti layers, to prevent undercutting of the Ti layer.

In an alternate embodiment of the present invention, each scan line includes a third layer of conductive material deposited on the second layer of Mo or Al and selected to adhere to any subsequently deposited overlying surface. The third layer is preferably Ti having a thickness of about 400 angstroms. The three layers are preferably deposited by sputtering in a single pumpdown. The layers may then be etched to provide tapered side walls for improved step coverage of subsequent layers.

The data lines addressing each column of pixels include at least a layer of molybdenum deposited on the insulation and semiconductor layers disposed between the scan and data lines at the crossovers, although, a multilayer conductor structure similar to that of the scan lines may be used as well.

DETAILED DESCRIPTION OF THE PREFERRED EMBODIMENTS

Figure 1:
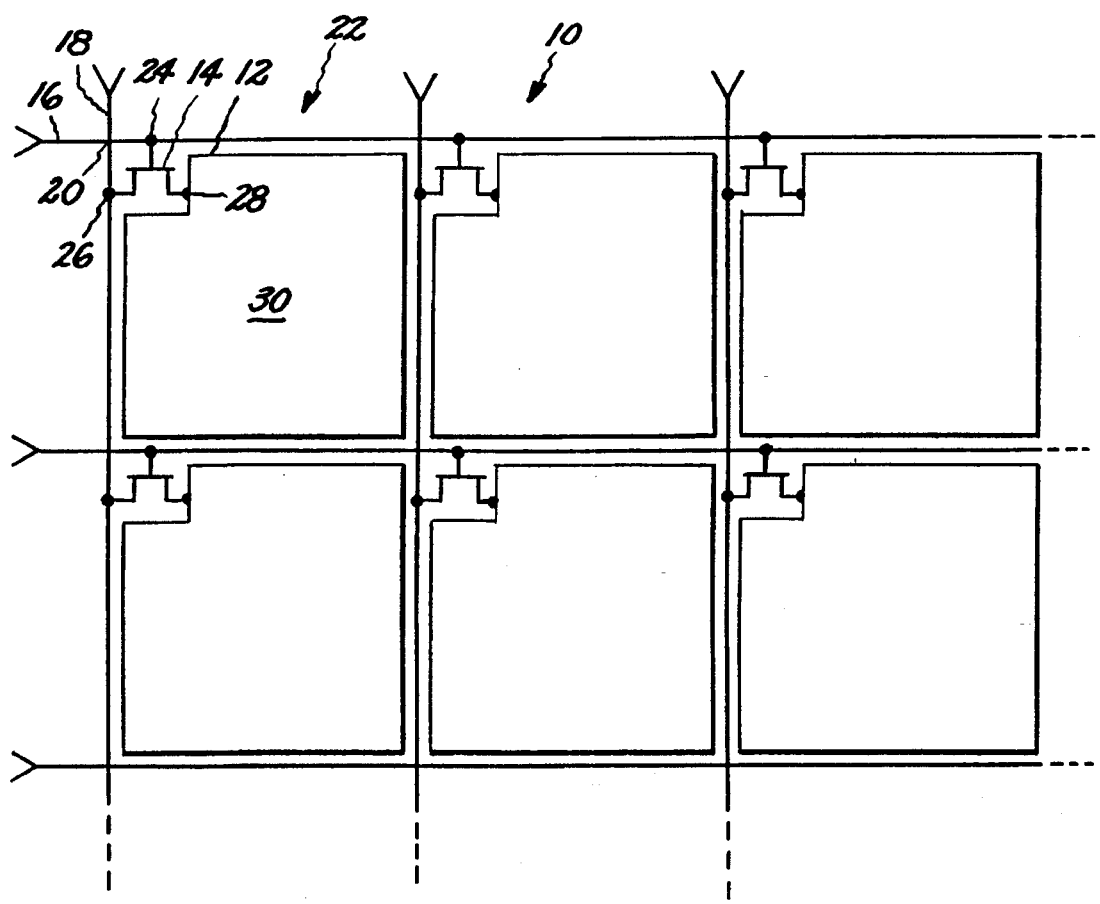
FIG. 1 is a schematic plan view of a portion of a thin-film transistor driven liquid crystal display device.

FIG. 1 is a schematic plan view of a portion of a liquid crystal display (LCD) device 10 which is formed from an array of a multiplicity of picture cells, picture elements or pixels 12. The pixels 12 are usually arranged in uniform columns and rows to form an X-Y matrix type structure. Conventional LCD devices typically have a semiconductor switch 14, such as a field-effect transistor and the like, which is integrally formed with each pixel 12 to control operation of the light transmissive characteristics of the pixel. Electrical signals are communicated by a plurality of X-address lines or scan lines 16 and a plurality of Y-address lines or data lines 18 to FETs 14 and pixels 12 for conversion to a visual signal. Typically, there is one scan line 16 for each row of pixels and one data line 18 for each column of pixels. Scan lines 16 usually run in one direction across the display and data lines 18 typically run in a direction substantially perpendicular to the scan lines; however, the scan and data lines may jog or snake back and forth (an undesirable arrangement) if the pixel elements are staggered. Scan lines 16 and data lines 18 insulatively traverse each other at locations 20, known as crossovers.

Figure 2:
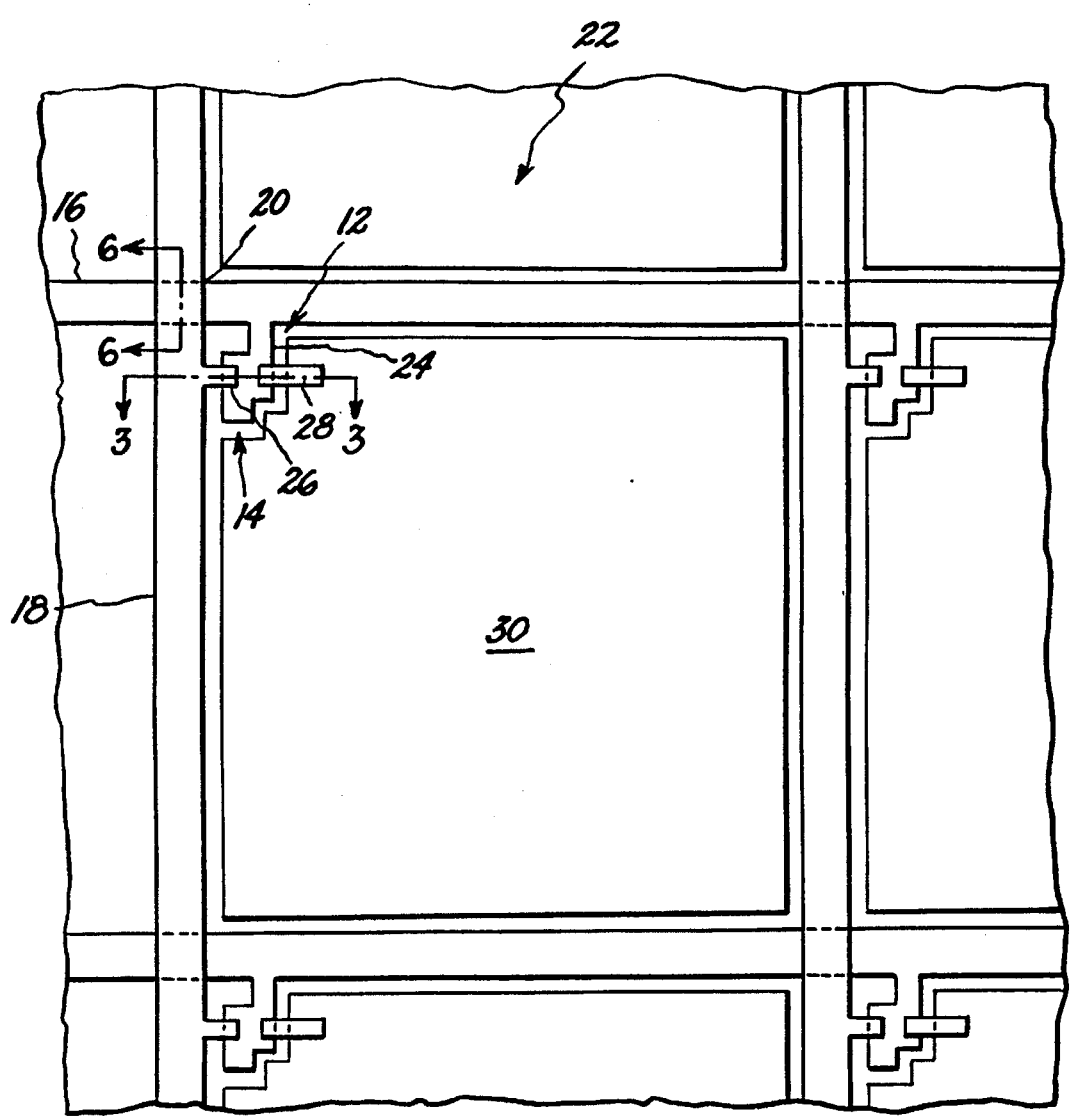
FIG. 2 is a detailed plan view of a portion of the LCD device of FIG. 1.

Referring also to FIG. 2, which is a detailed plan view of a single liquid crystal cell 22 of FIG. 1, a gate electrode 24 and a source electrode 26 of each FET 14 are respectively connected to a scan line 16 and a data line 18 for transferring electrical signals from the scan and data lines to pixel 12 for conversion to an optical signal. A drain electrode 28 of each FET 14 is connected to a pixel electrode 30 fabricated from a light transmissive material, such as indium tin oxide (ITO) and the like.

Figure 3:
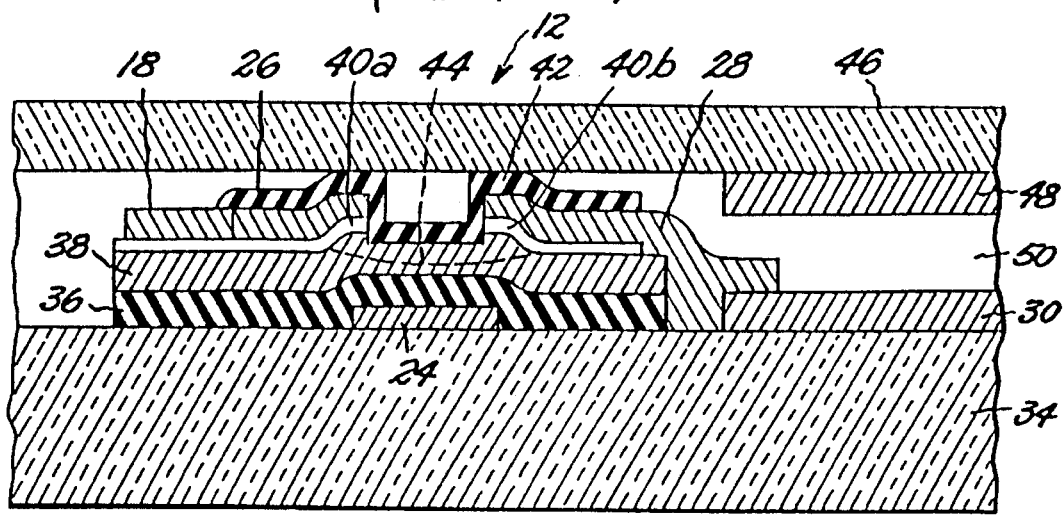
FIG. 3 is a cross-sectional view of a portion of a conventional liquid crystal cell of FIG. 2 taken along lines 3—3.

A cross-sectional view of a conventional FET 14 and a portion of a pixel 12 are shown in FIG. 3. A FET gate electrode 24, and pixel electrode 30 are formed on a glass substrate 34 by known photolithographic techniques. A layer 36 of hydrogenated silicon nitride ($Si_xN_y$:H) is deposited over gate 24 and a layer 38 of hydrogenated amorphous silicon (a-Si:H) is deposited over silicon nitride layer 36. Layers 36 and 38 are then patterned as shown in FIG. 3. A heavily doped layer 40 of hydrogenated amorphous silicon is formed and patterned on layer 38 to form source region 40a and drain region 40b. Regions 40a and 40b preferably have N+ conductivity. Silicon nitride layer 36 and silicon layers 38 and 40 are preferably deposited by plasma enhanced chemical vapor deposition (PECVD) which permits deposition of high quality films, at much lower substrate temperatures than conventional CVD. This low-temperature process further permits the use of a glass substrate 34.

Figure 4:
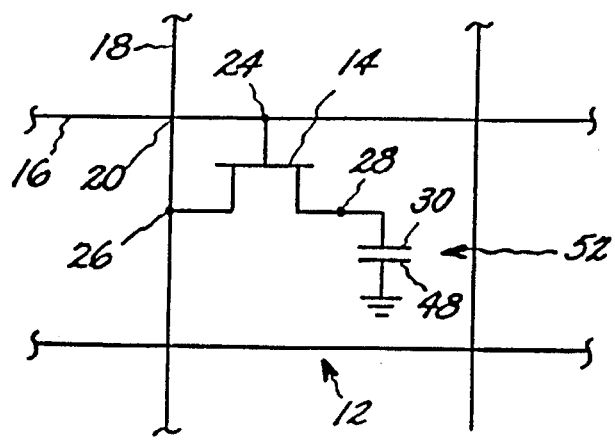
FIG. 4 is a schematic diagram of the equivalent circuit of a liquid crystal cell.

Metallization for data line 18 and source electrode 26 may be deposited and patterned at the same time with source electrode 26 in contact with data line 18 and source region 40a; drain electrode 28 is deposited and patterned in contact with drain region 40b and pixel electrode 30. A layer 42 of light-blocking material is formed over the FET to prevent light from being absorbed in a conductive channel 44 (shown bounded by a broken line in FIG. 3) of the FET which can cause photoconductive leakage, disrupting proper operation of the pixel. A layer 46 of glass covers the liquid crystal display 10. Thus, the FET and pixel are sandwiched between glass substrate 34 and cover glass 46. A ground plane electrode 48, which is common to all pixels in liquid crystal display 10, is formed on cover glass 46 at a spacing from pixel electrode 30. The volume 50 between electrodes 30 and 48 is filled with liquid crystal material and cover glass 46 is bonded to glass substrate 34 by a seal (not shown) at the perimeter of liquid crystal display 10. As shown in the cell equivalent circuit of FIG. 4, pixel electrode 30 and ground electrode 48 effectively form a pixel capacitor 52 connected between FET 14 and ground potential.

Figure 5:
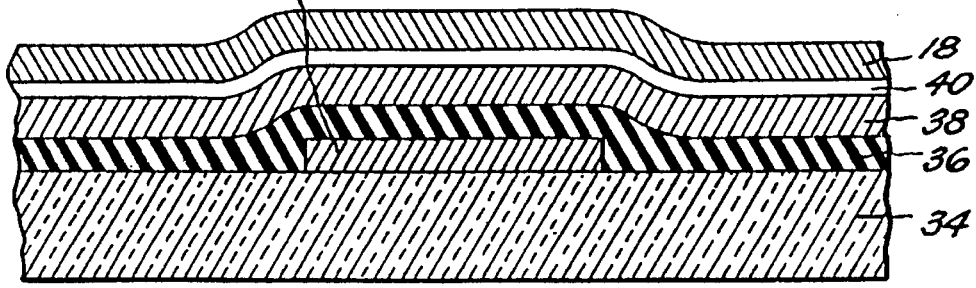
FIG. 5 is a cross-sectional view of a prior art scan line and data line at a crossover location.

A cross-sectional view of a conventional scan line 16 and data line 18 at a crossover 20 is shown in FIG. 5. Scan line 16 is formed by depositing a first layer of metallization having a thickness of about 2000 angstroms on substrate 34. Since the scan and data lines are usually formed with the FETs, a layer 36 of SiN having a thickness between 500 and 1500 angstroms is deposited over the scan line metallization, a layer 38 of a-Si having a thickness of about 2000 angstroms is deposited on SiN layer 36 and a layer 40 of heavily doped (preferably N+) a-Si having a thickness of about 500 angstroms is deposited upon layer 38. Data line 18 is formed by depositing a second layer of metallization with a thickness between about 1,000 and 10,000 angstroms on doped a-Si layer 40. Titanium is usually used for scan lines 16 because it etches well, exhibits good adhesion characteristics to substrate 34 and SiN layer 36 and can be laser-welded to repair open or shorted lines; however, titanium has a high bulk resistivity (42 µohm-cm) which will cause higher scan line RC time constants as LCD device size increases. Molybdenum is usually used for data lines 18 because it has a low bulk resistivity (5.2 µohm-cm). Molybdenum, however, may exhibit poor adhesion characteristics to nonmetals which can cause adhesion problems between data lines 18 and any underlying or overlying layers of material subsequently deposited.

In operation, an individual pixel 12 (FIG. 4) may be addressed by applying a scan line voltage of proper polarity and magnitude to scan line 16 to enhance the conductive channel 44 across a-Si:H layer 38, between source region 40a and drain region 40b. If a data voltage is applied to data line 18 while the scan line voltage is present, then pixel capacitor 52 will charge while the data voltage is also present and pixel capacitor 52 will store the charge after the scan line voltage has decreased to a level sufficient to deplete conductive channel 44 and switch FET 14 to a non-conductive state. This procedure is usually periodically repeated to refresh the charge on pixel capacitor 52; the LCD image is refreshed or updated at video rates, preferably about every $10^{-3}$ seconds or less, to maintain the image on the LCD and prevent flickering of the display. The quantity of light transmitted through pixel 12 is a function of the magnitude of the data line voltage applied to pixel electrode 30 and the charge on pixel capacitor 52.

Since the display is refreshed at video rates, the scan line voltage will be applied for only a few micro-seconds. During this time, scan line 16 must supply sufficient voltage to each FET 14 connected to that scan line to exceed the FET's characteristic gate-to-source threshold or turn-on voltage to cause FET 14 to switch to a conductive state. Likewise, the data line voltage is also only applied to data line 18 for only a few microseconds during which pixel capacitor 52 must charge to the desired potential. The ability for each scan line 16 and data line 18 to perform its function will be dependent upon the RC time constant of scan line 16 and data line 18. The scan line RC time constant is a function of the resistance and capacitance of the scan line itself and the internal resistance and capacitance of each FET connected to that scan line and the data line RC time constant is a function of the resistance and capacitance of the data line, the internal resistance and capacitance of each FET and the pixel capacitor; therefore, it is important that the scan line and data line RC time constants be as low as possible for efficient operation of the LCD. RC time constants will increase with the size of the LCDs because scan and data lines will become longer with more pixels connected to each line but the time period for each scan and data line to attain and hold the desired potential for proper operation of the LCD will decrease.

Figure 6A:
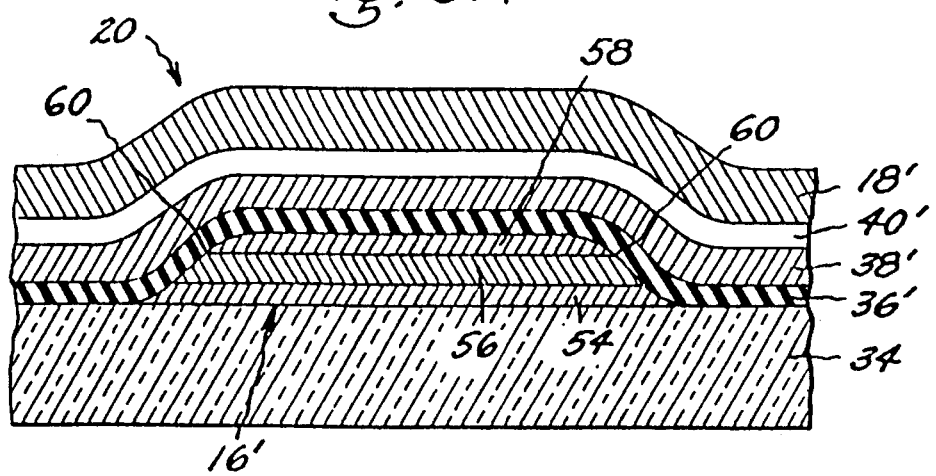
FIG. 6A is a cross-sectional view of a scan line and data line of FIG. 2 taken along lines 6—6 and in accordance with one embodiment of the present invention.

In accordance with the present invention, a multilayer scan line 16' is shown in FIG. 6A, which is a cross-sectional view of crossover 20 taken along lines 6—6 in FIG. 2. A first layer 54 of conductive material (preferably titanium), which exhibits good adhesion characteristics to other materials and is laser-weldable, is deposited on substrate 34 to a thickness of between about 400 and about 1000 angstroms. A thicker Ti layer is typically more reliable and facilitates making laser repairs. A second layer 56 of conductive material (preferably molybdenum or aluminum), which has a low bulk resistivity, is deposited on first layer 54 and has a thickness of about 1000 angstroms. A third layer 58 of conductive material (preferably titanium), which also exhibits good adhesion characteristics and is laser-weldable, may be deposited on second layer 56 and has a thickness from about 400 to about 1000 angstroms. The three conductive layers are preferably deposited by sputtering in a single pumpdown to avoid contamination and formation of moly oxide on the second layer 56 if molybdenum is used. Scan line 16' is preferably about 5 to 10 microns wide and about 0.2 to 0.4 microns high. For a 2"×2" LCD with a matrix array of about 500×500 pixels, the scan line resistance for a Ti/Al/Ti or an Al/Ti (read aluminum over titanium) scan line structure was measured to be about 1600 ohms compared to about 14,000 ohms for a conventional titanium-only scan line and the scan line resistance for a Ti/Mo/Ti scan line structure was about 4000 ohms; thus, Al is preferred as displays increase in size; even though, Al typically catastrophically disintegrates when laser-welded, the first or third Ti layers may be laser-welded to make line repairs.

As shown in FIG. 6A, the multi-layered scan line may be etched to taper the side edges 60 of scan line 16' so as to improve the step coverage of subsequently deposited layers. Titanium first layer 54 is preferably wet etched by floroboric acid ($HBF_4$) and if second layer 56 is Mo, the Mo is preferably wet etched by a PAWN (phosphoric acid, acetic acid, water and nitric acid) etch solution; titanium third layer 58 is preferably dry etched by placing the wafer in a plasma barrel etcher with an atmosphere of $CF_4$ and $O_2$ or $SF_6$ and $O_2$. If second layer 56 is Al, all three layers may be etched using an RIE etch of $BCl_3$, $CCl_4$ and $O_2$ which will etch the Al and Ti layers simultaneously and at the same rate, to prevent undercutting and possible step coverage problems when other layers of material are subsequently deposited. Aluminum second layer 56 is also susceptible to corrosion and may be dissolved when exposed to an ionic solution, such as photoresist stripper RIO and the like, because a chemical electromotive force may be created between the aluminum layer and other metals in the ionic solution; therefore, exposure of the aluminum second layer to ionic solutions during processing should be reduced or eliminated by using a non-ionic photoresist strip, such as PRS-1000 and the like. Aluminum second layer 56 may also be covered by a layer (not shown) of silicon nitride (SIN) during most of the fabrication process, as a further protective measure.

Since the scan lines and data lines are formed during the same process steps as the FETs 14, a layer 36' of passivation material, such as SiN and the like, is deposited over scan line 16'. A layer 38' of semiconductor material, preferably amorphous silicon (a-Si), is then deposited on layer 36'. A second layer 40' of semiconductor material, preferably also a-Si doped to have N+ conductivity, is formed on first semiconductor layer 38'. SiN layer 36' preferably has a thickness between about 500 and 1500 angstroms and semiconductor layers 38' and 40' preferably have a thickness of about 2000 angstroms and 500 angstroms, respectively. Data line 18' is deposited by sputtering over semiconductor layer 40' and has a thickness between 1,000 and 10,000 angstroms. Data line 18' metallization is preferably molybdenum to provide a low resistance pixel address line.

In an alternate embodiment, a scan line 16' may also be formed with a titanium first layer 54 and second layer 56 of molybdenum or aluminum without the second titanium layer 58 over second layer 56, but adhesion problems of subsequently deposited layers to second layer 56 may be encountered if layer 56 is molybdenum.

Figure 6B:
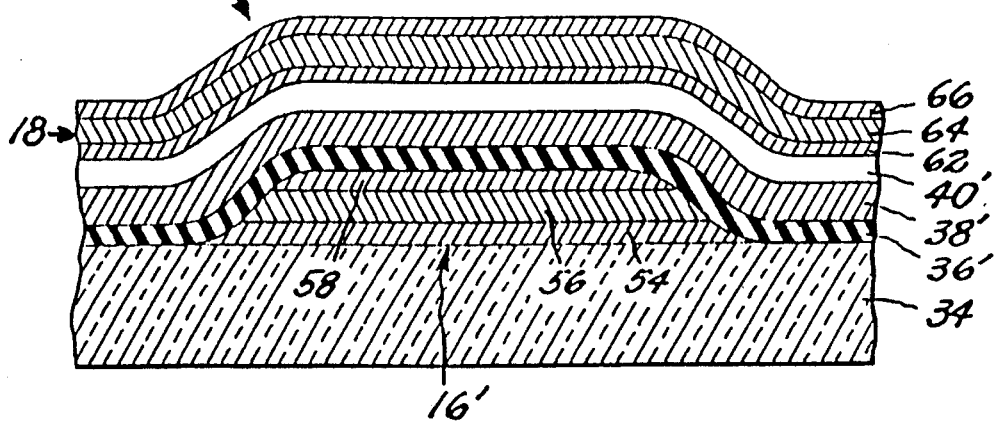
FIG. 6B is a cross-sectional view of a scan and data line of FIG. 2 taken along lines 6—6 and in accordance with another embodiment of the present invention.

A passivation layer (not shown) of SiN is usually formed over substantially the whole array and an alignment layer (not shown) of polyimide material or the like is usually formed over the passivation layer to provide proper alignment of the liquid crystal material when cover glass 46 is placed in position over glass substrate 34 and sealed to substrate 34 at the peripheral edges of the device. In a further alternate embodiment, data line 18' may, as shown in FIG. 6B, also have a multi-layer structure to promote adhesion to these subsequently deposited layers of material and to the underlying layer. A first layer 62 of conductive laser-weldable material (such as titanium), which exhibits good adhesion characteristics to other materials, is deposited on semiconductor layer 40' to promote good adhesion between data line 18' and layer 40'. A second layer 64 of conductive material, which has a low-bulk-resistance (such as molybdenum or aluminum), is deposited on first layer 62 to provide a low resistance address line, thereby avoiding the problems associated with a high RC time constant. A third layer 66 of conductive material, which also exhibits good adhesion characteristics, may be deposited on second layer 64 to promote good adhesion between data line 18' and subsequent layers of material deposited over data line 18'. First layer 62 and third layer 66 are preferably each between about 400 and about 1000 angstroms thick and second layer 64 is preferably about 1000 angstroms thick.

Figure 6C:
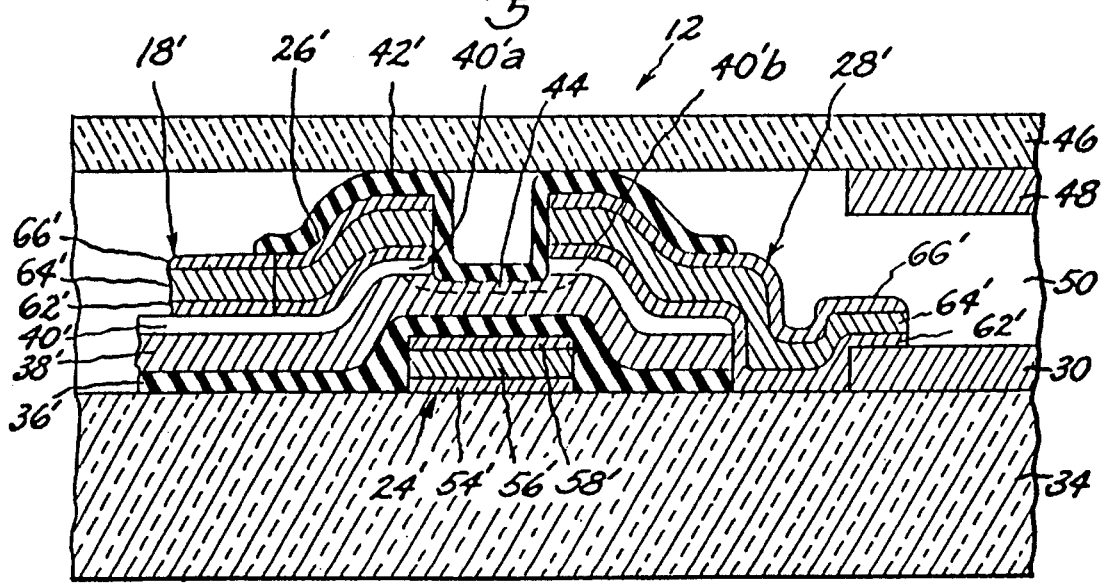
FIG. 6C is a cross-sectional view of a portion of a liquid crystal cell of FIG. 2 taken along lines 3—3 and in accordance with an embodiment of the present invention.

Since FET gate electrodes 24 are preferably formed during the same process step as scan lines 16' and are integrally formed with scan lines 16' gate electrode 24' may (as shown in FIG. 6C) also have a multi-layer conductor structure similar to scan line 16'. Gate electrode 24' may therefore include a first conductive layer 54', preferably of titanium and with a thickness of between about 400 and about 1000 angstroms; a second conductive layer 56', preferably of molybdenum or aluminum and with a thickness of about 1000 angstroms; and a third conductive layer 58', also preferably of titanium and with a thickness of between about 400 and about 1000 angstroms. Similarly, as the metallization for the FET source electrodes 26' and drain electrodes 28' is preferably deposited in the same process step as the metallization for data lines 18', source electrode 26' and drain electrode 28' may, as also shown in FIG. 6C, have a structure similar to data lines 18'. First conductive layer 62' is preferably titanium, having a thickness from about 400 to about 1000 angstroms to promote good adhesion to underlying semiconductor regions 40'*a* and 40'*b*; second conductive layer 64' is preferably molybdenum or aluminum, having a thickness of about 1000 angstroms to reduce the RC time constant of data line 18' for efficient operation of the LCD; and third conductive layer 66' is preferably titanium, having a thickness from about 400 to about 1000 angstroms, and may be deposited over layer 64' to promote good adhesion to any overlying layers of material which may be deposited, such as light-blocking material 42' or the like.

It will be readily understood by those skilled in the art that the present invention is not limited to the specific embodiments described and illustrated herein. Different embodiments and adaptations besides those shown herein and described, as well as many variations, modifications, and equivalent arrangements will now be apparent or will be reasonably suggested by the foregoing specification and drawings, without departing from the substance or scope of the invention. While the pixel cells were illustrated in the figures to be substantially square shaped, other geometric sizes and shapes could be utilized as well. Likewise, while the data lines and scan lines were shown to extend in substantially vertical and horizontal directions, it is also possible to employ data lines or scan lines so as to more closely resemble an oblique coordinate system. Those skilled in the art will also note that FET devices often exhibit symmetries in which the source and drain can be interchanged and that the source and drain designations exist only for convenience of explanation; such is the case with the present invention. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims appended hereto.

What is claimed is:

1. A method for fabricating scan and data lines for a liquid crystal display, comprising the steps of:

(a) forming a first layer of titanium in a first pattern on a substrate surface of the liquid crystal display;

(b) forming at least a second layer selected from the group consisting of molybdenum and aluminum, on the first titanium layer to form a multi-layer scan line;

(c) forming at least one layer of material on the multi-layer scan line to insulate the scan line from all data lines; and (d) forming at least a third layer selected from the group consisting of molybdenum and aluminum, in a second pattern and on the at least one insulation layer to form each of the data lines.

2. The method of claim 1, wherein steps (a) and (b) comprise the steps of sputtering each of the layers during a single pumpdown.

3. The method of claim 1, further comprising the step of tapering the multi-layer scan line to a degree selected to promote step coverage of materials subsequently deposited upon the scan line.

4. The method of claim 3, wherein the second layer is aluminum and the tapering step comprises the step of etching the first titanium layer and the second aluminum layer in a mixture of $BCl_3$, $CCl_4$ and $O_2$ gases.

5. The method of claim 3, further comprising the step of forming a fourth layer of titanium on the second layer.

6. The method of claim 5, wherein the tapering step comprises the step of wet etching the first titanium layer with $HBF_4$.

7. The method of claim 5, wherein the second layer is molybdenum and the tapering step comprises the step of wet etching the second molybdenum layer with a PAWN solution.

8. The method of claim 5, wherein the tapering step comprises the step of dry etching the fourth titanium layer in an atmosphere of $SF_6$ and $O_2$.

9. The method of claim 5, wherein the tapering step comprises the step of dry etching the fourth titanium layer in an atmosphere of $CF_4$ and $O_2$.

10. The method of claim 1, further comprising the step of forming a fifth layer of titanium in the second pattern after step (d).

11. The method of claim 1, further comprising the step of forming a fifth layer of titanium in the second pattern before step (d).

12. The method of claim 11, further comprising the step of forming a sixth layer of titanium in the second pattern after step (d).

* * * * *